US011436479B2

(12) United States Patent
Narayanan et al.

(10) Patent No.: US 11,436,479 B2
(45) Date of Patent: Sep. 6, 2022

(54) SYSTEM AND METHOD FOR TRANSFER OF ANALOG SYNAPTIC WEIGHT INFORMATION ONTO NEUROMORPHIC ARRAYS WITH NON-IDEAL NON-VOLATILE MEMORY DEVICE

(71) Applicant: INTERNATIONAL BUSINESS MACHINES CORPORATION, Armonk, NY (US)

(72) Inventors: Pritish Narayanan, San Jose, CA (US); Geoffrey W Burr, Cupertino, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1064 days.

(21) Appl. No.: 16/059,590

(22) Filed: Aug. 9, 2018

(65) Prior Publication Data

US 2020/0050928 A1     Feb. 13, 2020

(51) Int. Cl.
*G06N 3/06* (2006.01)
*G06N 3/063* (2006.01)
*G11C 11/54* (2006.01)
*G06N 3/04* (2006.01)

(52) U.S. Cl.
CPC .......... *G06N 3/0635* (2013.01); *G06N 3/049* (2013.01); *G11C 11/54* (2013.01)

(58) Field of Classification Search
CPC ...... G06N 3/0635; G06N 3/049; G11C 11/54; G11C 13/0004; G11C 2213/79
See application file for complete search history.

(56) References Cited

U.S. PATENT DOCUMENTS

| | | | |
|---|---|---|---|
| 4,385,611 A * | 5/1983 | Harper | F02D 41/2406 123/480 |
| 5,298,796 A | 3/1994 | Tawel | |
| 5,343,555 A | 8/1994 | Yayla et al. | |
| 8,812,415 B2 | 8/2014 | Modha | |
| 9,171,248 B2 | 10/2015 | Heliot et al. | |
| 9,269,042 B2 | 2/2016 | Friedman et al. | |
| 9,558,443 B2 | 1/2017 | Alvarez-Icaza et al. | |
| 2015/0200608 A1* | 7/2015 | Lin | H02M 3/156 363/131 |
| 2016/0034812 A1 | 2/2016 | Gibson et al. | |
| 2016/0267378 A1* | 9/2016 | Eleftheriou | G11C 13/004 |
| 2016/0350647 A1* | 12/2016 | Hosokawa | G06N 3/049 |
| 2016/0364643 A1 | 12/2016 | Cruz-Albrecht et al. | |

(Continued)

OTHER PUBLICATIONS

Burr et al., Large-scale neural networks implemented with non-volatile memory as the synaptic weight element: comparative performance analysis (accuracy, speed, and power), 2015, 4 pages (Year: 2015).*

(Continued)

*Primary Examiner* — Omar F Fernandez Rivas
*Assistant Examiner* — Tri T Nguyen
(74) *Attorney, Agent, or Firm* — Cantor Colburn LLP; Randall Bluestone

(57) ABSTRACT

A system and method are shown for transferring weight information to analog non-volatile memory elements wherein the programming pulse duration is directly proportional to the difference in weights. Furthermore, the system and method avoid weight transfers when the weights are already well-matched.

28 Claims, 3 Drawing Sheets

(56) References Cited

U.S. PATENT DOCUMENTS

| | | |
|---|---|---|
| 2017/0083810 A1 | 3/2017 | Ielmini et al. |
| 2017/0154259 A1 | 6/2017 | Burr et al. |
| 2017/0193353 A1 | 7/2017 | Lee |
| 2017/0228636 A1 | 8/2017 | Appuswamy et al. |

OTHER PUBLICATIONS

Narayanan et al., "Reducing Circuit Design Complexity for Neuromorphic Machine Learning Systems Based on Non-Volatile Memory Arrays," 2017 IEEE International Symposium on Circuits and Systems (ISCAS), May 28-31, 2017, Baltimore, MD, USA, 4pgs.

Noack et al., "Switch-capacitor realization of presynaptic short-term-plasticity and stop-learning synapses in 28 nm CMOS," Frontiers in Neuroscience, 9:10, Feb. 2, 2015, 14pgs.

Pfeil et al., "Is a 4-bit synaptic weight resolution enough?—constraints on enabling spike-timing dependent plasticity in neuromorphic hardware," Frontier in Neuroscience, 6:90, Jul. 17, 2012, 19pgs.

Burr et al., "Neuromorphic computing using non-volatile memory," Advances in Physics: X, 2:1, Dec. 9, 2017, pp. 89-124.

\* cited by examiner

SYSTEM AND METHOD FOR TRANSFER OF ANALOG SYNAPTIC WEIGHT INFORMATION ONTO NEUROMORPHIC ARRAYS WITH NON-IDEAL NON-VOLATILE MEMORY DEVICE

BACKGROUND OF THE INVENTION

Field of Invention

The present invention relates generally to the field of artificial neural networks (ANN). More specifically, the present invention is related to a system and method for transfer of analog synaptic weight information onto neuromorphic arrays with non-ideal non-volatile memory devices.

Discussion of Related Art

Non-volatile memory-based crossbar arrays can be used in neuromorphic non-von Neumann computing schemes, for example in multi-layer perceptrons trained using backpropagation (see FIG. 1) potentially achieving orders of magnitude power and performance benefits over software implementations. Here, programmable synaptic elements based on non-volatile memory devices serve as analog weights, whose conductances are tuned by training over large datasets to achieve high accuracies on a range of tasks such as image and speech recognition. In addition to small changes in the conductance of the devices during example-by-example training (also known as the weight update step), there are several scenarios during training where larger changes to weights may be required. This includes, but is not limited to, i) periodically transferring weight information from a low significance to a higher significance conductance element and ii) doing weight overrides, wherein an external parameter server consolidates weight information from distributed learners and sends out a new batch of weights for all the learners to use.

Embodiments of the present invention are an improvement over prior art systems and methods.

SUMMARY OF THE INVENTION

A method for transferring weight information to analog non-volatile memory elements wherein the programming pulse duration is directly proportional to the difference in weights is disclosed. Furthermore, an idea for avoiding weight transfers when the weights are already well matched is also disclosed.

In one embodiment, the present invention provides for a system for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the system comprising: (a) a first, reference, capacitor, the first capacitor storing a voltage level corresponding to a net synaptic weight that needs to be achieved, the first capacitor charged up by a parallel read operation across conductances of higher significance $G^+$ and $G^-$ and conductances of lower significance $g^+$ and $g^-$ (capacitive cells), with a first voltage level accumulated on the first capacitor representative of a net synaptic weight given by $F(G^+-G^-)+g^+-g^-$, where F is a scale factor for higher significance; (b) a second capacitor, wherein when (i) the conductances of lower significance $g^+$ and $g^-$ are zeroed out, and (ii) a read operation is performed, a second voltage level is accumulated on the second capacitor representing a synaptic weight contribution from just the conductances of higher significance $F(G^+-G^-)$, (c) a comparator with inputs connected to the first capacitor and the second capacitor for comparing the first voltage level associated with the first capacitor and the second voltage level associated with the second capacitor, and (d) a weight transfer operation transferring synaptic weights such that the net synaptic weight is represented using to primarily the conductances of higher significance $G^+$ and $G^-$, the weight transfer operation being done by applying a programming pulse to one of the conductances of higher significance $G^+$ or $G^-$ depending on the output of the comparator, a width of the programming pulse being proportional to the difference in voltages between the first and second capacitors.

In another embodiment, the present invention provides for a system for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the system comprising: (a) a first, reference, capacitor, the first capacitor storing a voltage level corresponding to a net synaptic weight that needs to be achieved, the first capacitor charged up by a parallel read operation across conductances of higher significance $G^+$ and $G^-$ and conductances of lower significance $g^+$ and $g^-$, with a first voltage level accumulated on the first capacitor representative of a net synaptic weight given by $F(G^+-G^-)+g^+-g^-$, where F is a scale factor for higher significance; (b) a second capacitor, wherein when (i) the conductances of lower significance $g^+$ and $g^-$ are zeroed out, and (ii) a read operation is performed, a second voltage level is accumulated on the second capacitor representing a synaptic weight contribution from just the conductances of higher significance $F(G^+-G^-)$; (c) a comparator with inputs connected to the first capacitor and the second capacitor for comparing the first voltage level associated with the first capacitor and the second voltage level associated with the second capacitor; (d) an offset operation, wherein depending on the output of the comparator, a small amount of charge is bled into or out of the second capacitor using a pull-up or pull-down circuitry, wherein when the first and second voltage levels are close, the output of the comparator is flipped, ensuring that no programming pulse is fired in a subsequent weight transfer operation; and (e) a weight transfer operation transferring synaptic weights such that the net synaptic weight is represented using primarily the conductances of higher significance $G^+$ and $G^-$, the weight transfer operation being done by applying a programming pulse to one of the conductances of higher significance $G^+$ or G depending on the output of the comparator, a width of the programming pulse being proportional to the difference in voltages between the first and second capacitors.

In yet another embodiment, the present invention provides for a method for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the method comprising: (a) storing a voltage level in a first, reference, capacitor corresponding to a net synaptic weight that needs to be achieved, the first capacitor charged up by a parallel read operation across conductances of higher significance $G^+$ and $G^-$ and conductances of lower significance $g^+$ and $g^-$, with a first voltage level accumulated on the first capacitor representative of a net synaptic weight given by $F(G^+-G^-)+g^+-g^-$, where F is a scale factor for higher significance; (b) zeroing the conductances of lower significance $g^+$ and $g^-$, and performing a read operation, and accumulating a second voltage level in the second capacitor representing a synaptic weight contribution from just the conductances of higher significance $F(G^+-G^-)$, (c) comparing the first voltage level associated with the first capacitor and the second voltage level associated with the second capacitor using a comparator with inputs connected to the first capacitor and the second capacitor for, and (d) transferring synaptic weights using a weight transfer operation such that the net synaptic weight is represented using primarily the conductances of higher significance $G^+$ and $G^-$, the weight transfer operation being done by applying a programming pulse to one of the conductances of higher significance $G^+$ or $G^-$ depending on the output of the comparator, a width of the programming pulse being proportional to the difference in voltages between the first and second capacitors.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

DESCRIPTION OF THE PREFERRED EMBODIMENTS

Figure 1:
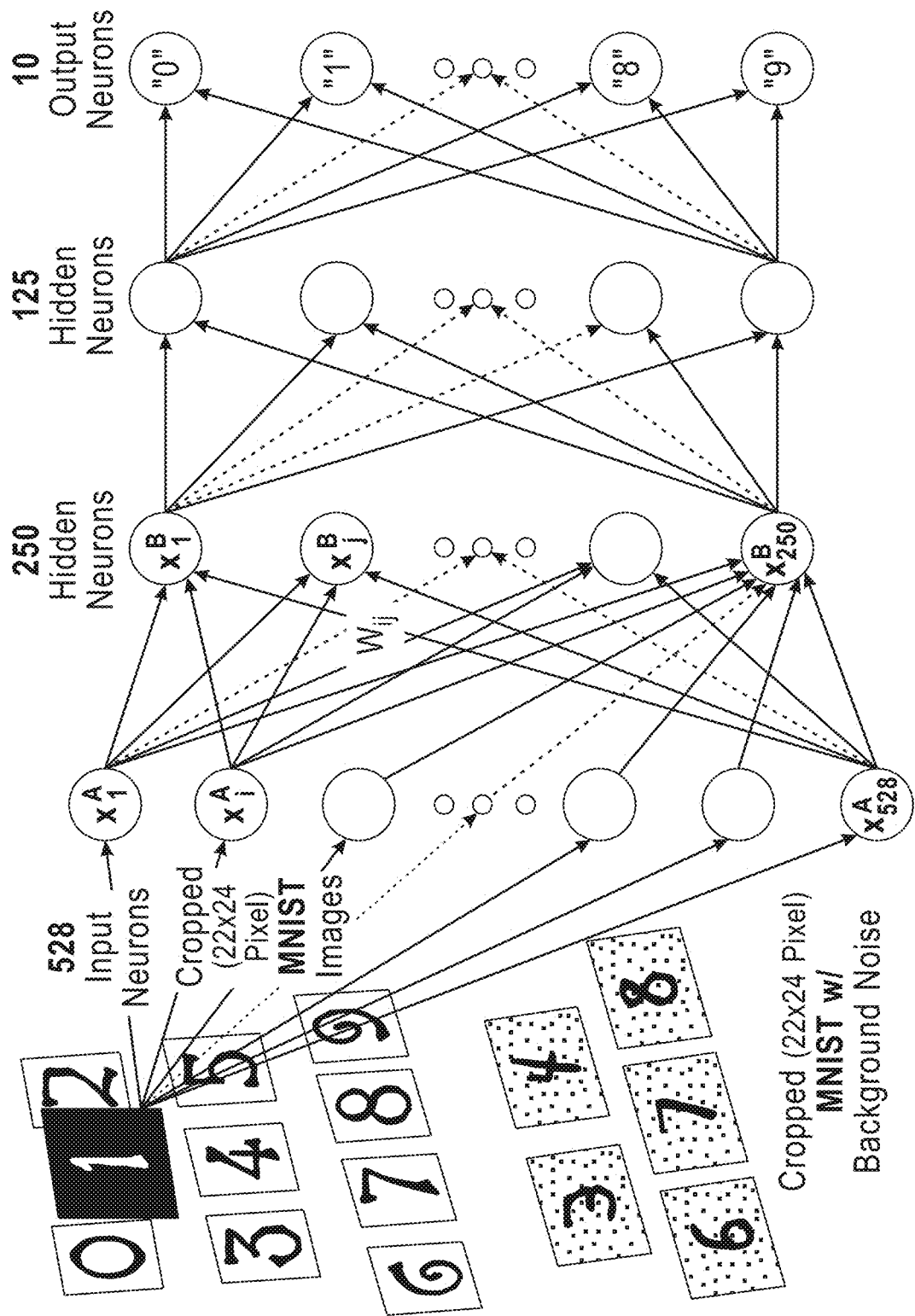
FIG. 1 illustrates multilayer perceptrons that can be trained using backpropagation for tasks such as image recognition.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

This invention describes a method for implementing weight transfer into non-ideal NVMs that suffer from non-linearity, asymmetry and variability in their conductance response. On such devices, to ensure reasonably accurate weight transfer, a write-plus-verify scheme will be necessary.

To describe the main idea, the first scenario described above, i.e. transfer of weight information from a low significance to a higher significance conductance element is considered. In this example, it is assumed that the lower significance element is a volatile capacitor cell, which while being linear and symmetric in its up/down conductance response, is also volatile, and therefore loses weight training information if not transferred to a higher significance Phase Change Memory (PCM) element that is non-volatile, but is subject to a high amount of variability and non-linearity. Once the main idea is described, its applicability to the second scenario, i.e. weight overrides, will also be described.

Figure 2:
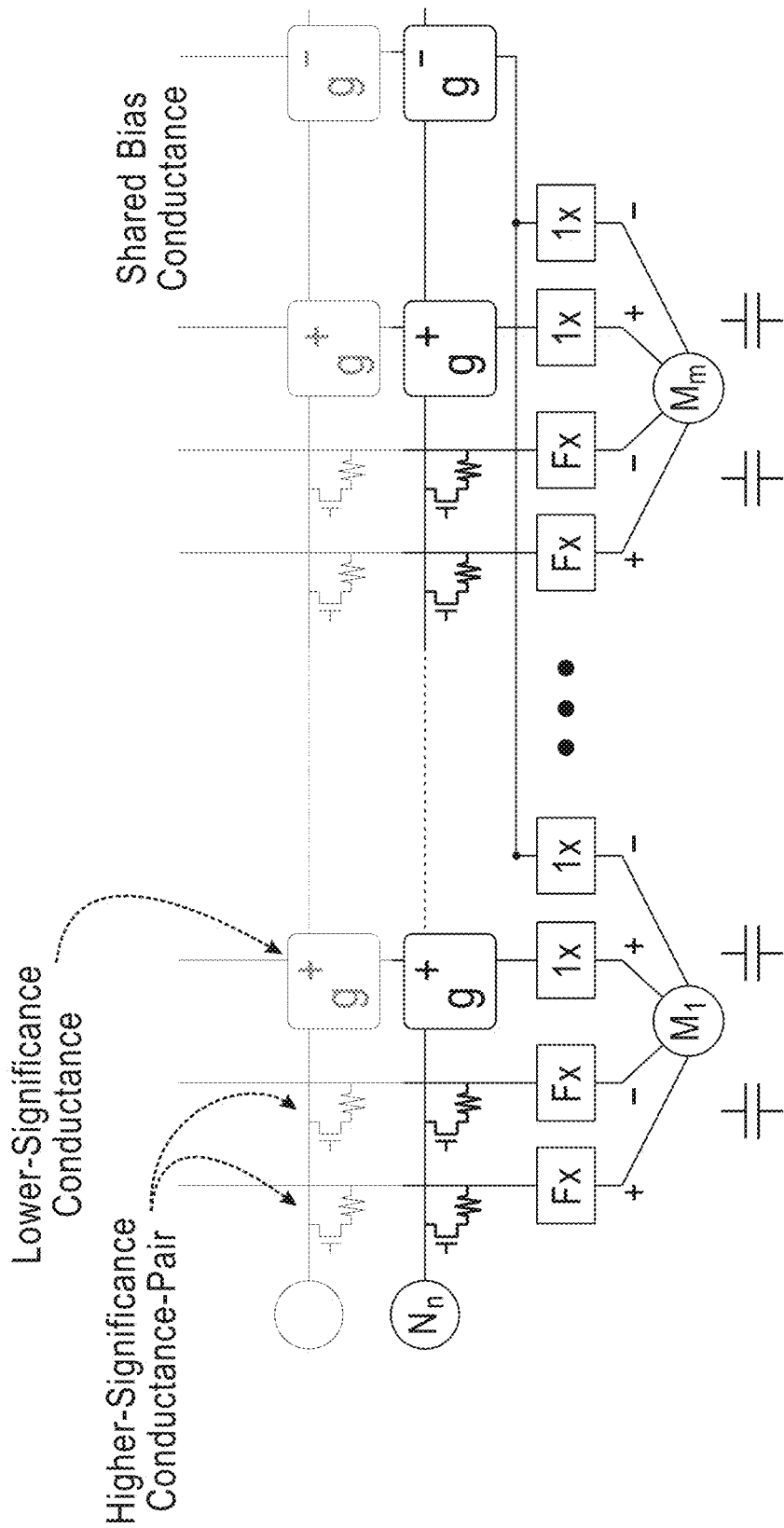
FIG. 2 illustrates a synaptic weight that is implemented as linear combination of multiple analog elements.

FIG. 2 illustrates a synaptic weight that is implemented as a linear combination of multiple analog elements. In this example, the net weight is equal to $F(G^+-G^-)+g^+-g^-$. One implementation uses non-linear non-volatile PCM elements as the higher significance G+ and G−, and relatively linear but volatile capacitive cells as the lower significance g+ and g−. The method disclosed uses two capacitors 302 and 304 for storage and comparison (see FIG. 3). The first capacitor 302 stores a voltage level that corresponds to the net synaptic weight that needs to be achieved. This is also referred to as the reference capacitor. This capacitor 302 is charged up by a parallel read operation across both the higher significance and lower significance cells, and its final voltage is representative of the quantity $F(G+-G-)+g+-g-$, where $G^+$ and $G^-$ represent the conductances of the higher significance cells (PCM devices in our example), F is the scale factor for higher significance, and g+ and g− are the lower significance conductances (capacitive cells in our example).

In one non-limiting example, the scale factor F is picked to have a value of 3.0, meaning that the conductance values stored in the higher significance cells are 3 times as important as the conductance values stored in the lower significance cells. It should be noted that the term 'significance' as used here is in the context of place values, i.e., in the decimal number 42, the digit 4 in the 10s place is 10 times more significant than the digit 2.

The choice of the scale factor, F, is driven by various properties of the physical devices and the application itself, e.g., what is the dynamic range of the lower significance pair, how many updates are happening in relation to how volatile the information stored in the lower significance pair is, how much variability is there in the higher significance pair etc. The choice of 3.0 appears to work well for the scheme outlined in this patent application, but it should be noted that the scale factor could be other values as defined by factors outlined above. Hence, the value of the scale factor should not be used to limit the scope of the invention.

The goal of the transfer operation is to ideally have this net weight be represented entirely on the PCM devices. To this end, the g+ and g− conductances are zeroed out, and a read operation is again performed, with a voltage level accumulated on a second capacitor 304. The voltage level on capacitor 304 is now commensurate with $F(G+-G-)$, or just the contribution from the higher significance (PCM) element. A programming pulse to the appropriate PCM cell is applied, whose width is proportional to the difference in voltages between the two capacitors 302 and 304. With iterative tuning, i.e., performing the read operation again and applying more programming pulses as needed, the voltage level on capacitor 304 can be made to match more closely that of capacitor 302, i.e., the eventual weight stored in the conductances of higher significance has to be very close to the original reference synaptic weight value. In one non-limiting example, the error threshold in terms of matching the two quantities is typically half a standard deviation of the variability in the conductance change when a pulse is fired. The 'closeness' of the voltage levels will be proportional to this quantity. However, the actual number in terms of milli-volts or volts would depend on the exact circuit implementation—e.g., the proportionality constant between the voltage difference and the generated pulse width, the current that is bled in to or out of the second capacitor during read and transfer, etc. In another non-limiting example, only a small number of iterations (e.g., 8-20 iterations) are used to see if a close matching may be achieved.

Figure 3:
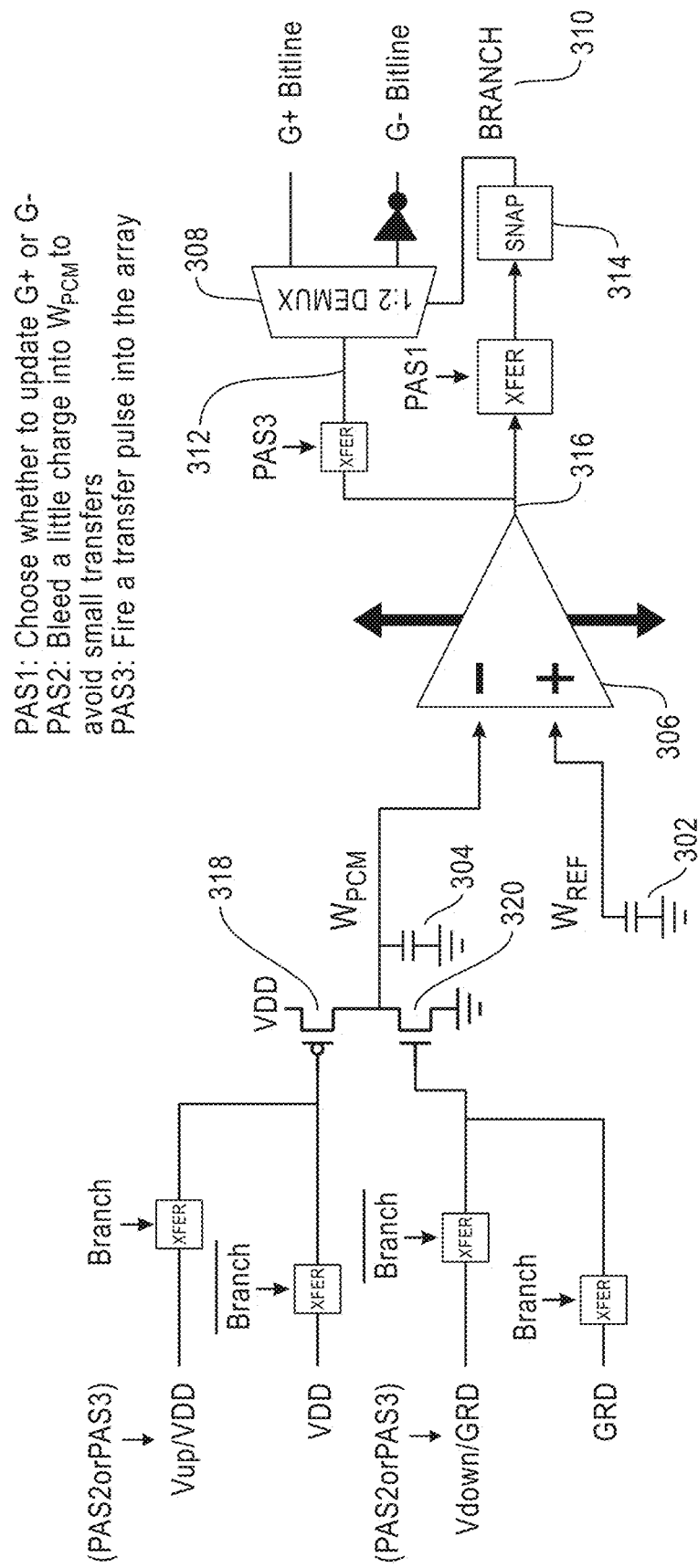
FIG. 3 illustrates the present invention's disclosed weight transfer circuitry with three phase operation.

FIG. 3 depicts the present invention's disclosed weight transfer circuitry with three-phase operation. The three-phase operation is used to generate this pulse. This is described below:

1) Phase 1 (P1): In this phase (i.e., P1), the values in the two capacitors (capacitor 302 and capacitor 304) are compared by a comparator 306, and a single sign bit (Sign) 310 is saved by the SNAP circuitry 314. The sign bit 310 determines whether the programming pulse (Prog. PULSE 312, which is generated in Phase 3) is directed to the G+ conductance or the G− conductance, using the De-multiplexer (1:2 Demux) 308.

2) Phase 2 (P2): P2 is the 'bleed phase'. The comparator output 316 is fed-back to the second capacitor 304 through either a pull-up circuit 318 or a pull-down circuit 320. The pull-up circuit 318 adds current to the second capacitor 304, increasing its voltage. The pull-down circuit 320 removes current from the second capacitor 304, decreasing its voltage. The feedback loop makes this self-limiting. That is, if during this bleed phase, the comparator output 316 changes because the voltage of the second capacitor 304 crosses the voltage of the first capacitor 302, the pull-up 318 or pull-down circuit 320 turns off.

3) Phase 3 (P3): P3 is the 'programming phase'. In this case, the comparator output 316 becomes a programming pulse that is directed to either G+ or G− based on the sign. The feedback loop determines the time for which this pulse is on. Identical to P2, current is bled in or bled out of the second capacitor 304 causing the output of the comparator 306 to flip and stopping the programming pulse.

This 3-phase operation can be carried out in an iterative fashion for more effective weight transfer. Between iterations, the new effective weight of the PCM cells is read out, updating the voltage level of the second capacitor 304. The decay time constant of the reference capacitor is typically on the order of milliseconds and is ample for the time scales used for transfer. Therefore, there is no danger of losing the original weight information.

The very same mechanism can be used for weight overrides with two very minor modifications. Instead of setting the reference voltage based on reading the original synaptic weight, this voltage level is set based on weight information from a peripheral circuit that communicates with the centralized parameter server. Furthermore, the graduated weight programming described above for transfer to just the higher significance pair, $G^+-G^-$, can be performed twice in succession: once to get the higher significance pair close to the target weight value, and again on the lower significance pair, $g^+-g^-$, to allow the weight programmed on the device array to get as close as possible to the target weight, as requested by the centralized parameter server or other off-chip resource. In fact, even in a scenario with only one conductance pair, this graduated weight programming procedure could be used for efficient weight programming.

In one embodiment, the present invention provides for a system for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the system comprising: (a) a first, reference, capacitor, the first capacitor storing a voltage level corresponding to a net synaptic weight that needs to be achieved, the first capacitor charged up by a parallel read operation across conductances of higher significance $G^+$ and $G^-$ and conductances of lower significance $g^+$ and $g^-$ (capacitive cells), with a first voltage level accumulated on the first capacitor representative of a net synaptic weight given by $F(G^+-G^-)+g^+-g^-$, where F is a scale factor for higher significance; (b) a second capacitor, wherein when the conductances of lower significance $g^+$ and $g^-$ are zeroed out, and a read operation is performed, a second voltage level is accumulated on the second capacitor representing a synaptic weight contribution from just the conductances of higher significance $F(G^+-G^-)$, (c) a comparator with inputs connected to the first capacitor and the second capacitor for comparing the first voltage level associated with the first capacitor and the second voltage level associated with the second capacitor, and (d) a weight transfer operation transferring synaptic weights such that the net synaptic weight is represented using primarily the conductances of higher significance $G^+$ and $G^-$, the weight transfer operation being done by applying a programming pulse to one of the conductances of higher significance $G^+$ or $G^-$ depending on the output of the comparator, a width of the programming pulse being proportional to the difference in voltages between the first and second capacitors.

In another embodiment, the present invention provides for a system for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the system comprising: (a) a first, reference, capacitor, the first capacitor storing a voltage level corresponding to a net synaptic weight that needs to be achieved, the first capacitor charged up by a parallel read operation across conductances of higher significance $G^+$ and $G^-$ and conductances of lower significance $g^+$ and $g^-$, with a first voltage level accumulated on the first capacitor representative of a net synaptic weight given by $F(G^+-G^-)+g^+-g^-$, where F is a scale factor for higher significance; (b) a second capacitor, wherein when the conductances of lower significance $g^+$ and $g^-$ are zeroed out, and a read operation is performed, a second voltage level is accumulated on the second capacitor representing a synaptic weight contribution from just the conductances of higher significance $F(G^+-G^-)$; (c) a comparator with inputs connected to the first capacitor and the second capacitor for comparing the first voltage level associated with the first capacitor and the second voltage level associated with the second capacitor; (d) an offset operation, wherein depending on the output of the comparator, a small amount of charge is bled into or out of the second capacitor using a pull-up or pull-down circuitry, wherein when the first and second voltage levels are close, the output of the comparator is flipped, ensuring that no programming pulse is fired in a subsequent weight transfer operation; and (e) a weight transfer operation transferring synaptic weights such that the net synaptic weight is represented using primarily the conductances of higher significance $G^-$ and $G^-$, the weight transfer operation being done by applying a programming pulse to one of the conductances of higher significance $G^+$ or $G$ depending on the output of the comparator, a width of the programming pulse being proportional to the difference in voltages between the first and second capacitors.

In yet another embodiment, the present invention provides for a method for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the method comprising: (a) storing a voltage level in a first, reference, capacitor corresponding to a net synaptic weight that needs to be achieved, the first capacitor charged up by a parallel read operation across conductances of higher significance $G^+$ and $G^-$ and conductances of lower significance $g^+$ and $g^-$, with a first voltage level accumulated on the first capacitor representative of a net synaptic weight given by $F(G^+-G^-)+g^+-g^-$, where F is a scale factor for higher significance; (b) zeroing the conductances of lower significance $g^+$ and $g^-$, and performing a read operation, and accumulating a second voltage level in the second capacitor representing a synaptic weight contribution from just the conductances of higher significance $F(G^+-G^-)$, (c) comparing the first voltage level associated with the first capacitor and the second voltage level associated with the second capacitor using a comparator with inputs connected to the first capacitor and the second capacitor for, and (d) transferring synaptic weights using a weight transfer operation such that the net synaptic weight is represented using primarily the conductances of higher significance $G^-$ and $G^-$, the weight transfer operation being done by applying a programming pulse to one of the conductances of higher significance $G^-$ or $G^-$ depending on the output of the comparator, a width of the programming pulse being proportional to the difference in voltages between the first and second capacitors.

CONCLUSION

A system and method have been shown in the above embodiments for the effective implementation of transferring analog synaptic weight information onto neuromorphic arrays with non-ideal non-volatile memory device. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A system for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the system comprising:
   a first, reference, capacitor, the first capacitor storing a voltage level corresponding to a net synaptic weight that needs to be achieved, the first capacitor charged up by a parallel read operation across conductances of higher significance $G^+$ and $G^-$ and conductances of lower significance $g^+$ and $g^-$ (capacitive cells), with a first voltage level accumulated on the first capacitor representative of a net synaptic weight given by $F(G^+-G^-)+g^+-g^-$, where F is a scale factor for higher significance;
   a second capacitor, wherein when (i) the conductances of lower significance $g^+$ and $g^-$ are zeroed out and (ii) a read operation is performed, a second voltage level is accumulated on the second capacitor representing a synaptic weight contribution from just the conductances of higher significance $F(G^+-G^-)$,
   a comparator with inputs connected to the first capacitor and the second capacitor for comparing the first voltage level associated with the first capacitor and the second voltage level associated with the second capacitor, and
   a weight transfer operation transferring synaptic weights such that the net synaptic weight is represented using primarily the conductances of higher significance $G^+$ and $G^-$, the weight transfer operation being done by applying a programming pulse to one of the conductances of higher significance $G^+$ or $G^-$ depending on the output of the comparator, a width of the programming pulse being proportional to the difference in voltages between the first and second capacitors, wherein in response to the first and second voltage levels being within a predetermined value of each other, the output of the comparator is flipped, ensuring that no programming pulse is fired in the subsequent weight transfer operation, with the programming pulse being terminated in response to the second voltage level associated with the second capacitor crossing the first voltage level associated with the first capacitor in either direction, inverting the output of the comparator.

2. The system of claim 1, wherein depending on the output of the comparator, a pull-up or pull-down circuitry is used as part of an offset operation to bleed a small amount of charge into or out of the second capacitor.

3. The system of claim 2, wherein when the programming pulse is input, and simultaneously depending on a branch value associated with one of the conductances of higher significance $G^+$ or $G$, charge is bled into or out of the second capacitor using the pull-up/pull-down circuitry.

4. The system of claim 1, wherein for a weight override operation, the first voltage level associated the first capacitor is based on weight information from a peripheral circuit that receives the weight information from an external source.

5. The system of claim 4, wherein the weight override operation is performed on neuromorphic arrays where the synaptic weight is represented by a single conductance pair $(G^+-G^-)$.

6. The system of claim 1 wherein, with iterative tuning, the second voltage level is made to be within a predetermined value of the first voltage.

7. The system of claim 6, wherein any residual error in the weight transfer operation is programmed back into the lower significance pair $g^+$ and $g^-$, allowing a final weight to be within a predetermined value of a target weight.

8. The system of claim 1, wherein the conductances of higher significance are implemented using Phase Change Memory (PCM) based devices.

9. The system of claim 1, wherein the conductances of lower significance are implemented using capacitive cells.

10. The method of claim 1, wherein neurons in the ANN are implemented with CMOS circuitry.

11. The method of claim 1, wherein the synaptic weight of each synapse is implemented using an analog memory element.

12. The method of claim 11, wherein the analog memory element is a non-volatile memory (NVM) element.

13. The method of claim 12, wherein the NVM element is selected from the group consisting of: phase-change memory element, resistive random access memory element, and conducting bridge random access memory element.

14. A system for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the system comprising:
   a first, reference, capacitor, the first capacitor storing a voltage level corresponding to a net synaptic weight that needs to be achieved, the first capacitor charged up by a parallel read operation across conductances of higher significance $G^+$ and $G^-$ and conductances of lower significance $g^+$ and $g^-$, with a first voltage level accumulated on the first capacitor representative of a net synaptic weight given by $F(G^+-G^-)+g^+-g^-$, where F is a scale factor for higher significance;
   a second capacitor, wherein when (i) the conductances of lower significance $g^+$ and $g^-$ are zeroed out, and (ii) a read operation is performed, a second voltage level is accumulated on the second capacitor representing a synaptic weight contribution from just the conductances of higher significance $F(G^+-G^-)$,
   a comparator with inputs connected to the first capacitor and the second capacitor for comparing the first voltage level associated with the first capacitor and the second voltage level associated with the second capacitor,
   a pull-up or pull-down circuitry, the pull-up or pull down circuitry, depending on the output of the comparator, used as part of an offset operation to bleed a small amount of charge into or out of the second capacitor, wherein when the first and second voltage levels are within a predetermined value of each other, the output of the comparator is flipped, ensuring that no programming pulse is fired in the subsequent weight transfer operation; and
   a weight transfer operation transferring synaptic weights such that the net synaptic weight is represented using primarily the conductances of higher significance $G^-$ and $G^-$, the weight transfer operation being done by applying a programming pulse to one of the conductances of higher significance $G^+$ or G depending on the output of the comparator, a width of the programming pulse being proportional to the difference in voltages between the first and second capacitors, wherein in response to the programming pulse being input, and simultaneously depending on a branch value associated with one of the conductances of higher significance $G^+$ or $G^-$, charge is bled into or out of the second capacitor using the pull-up or pull-down circuitry, with the programming pulse terminated in response to the second voltage level associated with the second capacitor crossing the first voltage level associated with the first capacitor in either direction, inverting the output of the comparator.

15. The system of claim 14, wherein for a weight override operation, the first voltage level associated the first capacitor is based on weight information from a peripheral circuit that receives the weight information from an external source.

16. The system of claim 15, wherein the weight override operation is performed on neuromorphic arrays where the synaptic weight is represented by a single conductance pair $(G^+-G^-)$.

17. The system of claim 14, wherein with iterative tuning, the second voltage level is within a predetermined value of the first voltage level.

18. The system of claim 17, wherein any residual error in the weight transfer operation is programmed back into the lower significance pair g+ and g–, allowing a final weight to be within a predetermined value of a target weight.

19. The system of claim 15, wherein the conductances of higher significance are implemented using Phase Change Memory (PCM) based devices.

20. The system of claim 15, wherein the conductances of lower significance are implemented using capacitive cells.

21. The system of claim 15, wherein neurons in the ANN are implemented with CMOS circuitry.

22. The system of claim 15, wherein the synaptic weight of each synapse is implemented using an analog memory element.

23. The system of claim 22, wherein the analog memory element is a non-volatile memory (NVM) element.

24. The system of claim 23, wherein the NVM element is selected from the group consisting of: phase-change memory element, resistive random access memory element, and conducting bridge random access memory element.

25. A method for transfer of analog synaptic weight information onto neuromorphic arrays with non-ideal non-volatile memory devices in an artificial neural network (ANN), wherein a synaptic weight of each synapse in the ANN is represented by a weighted current flow from multiple conductance-pairs, the method comprising:
   storing a voltage level in a first, reference, capacitor corresponding to a net synaptic weight that needs to be achieved, the first capacitor charged up by a parallel read operation across conductances of higher significance $G^+$ and $G^-$ and conductances of lower significance $g^+$ and $g^-$, with a first voltage level accumulated on the first capacitor representative of a net synaptic weight given by $F(G^+-G^-)+g^+-g^-$, where F is a scale factor for higher significance;
   zeroing the conductances of lower significance $g^+$ and $g^-$, and performing a read operation, and accumulating a second voltage level in the second capacitor representing a synaptic weight contribution from just the conductances of higher significance $F(G^+-G^-)$,
   comparing the first voltage level associated with the first capacitor and the second voltage level associated with the second capacitor using a comparator with inputs connected to the first capacitor and the second capacitor for, and
   transferring synaptic weights using a weight transfer operation such that the net synaptic weight is represented using primarily the conductances of higher significance $G^+$ and $G^-$, the weight transfer operation being done by applying a programming pulse to one of the conductances of higher significance $G^+$ or $G^-$ depending on the output of the comparator, a width of the programming pulse being proportional to the difference in voltages between the first and second capacitors, wherein in response to the programming pulse being input, and simultaneously depending on a branch value associated with one of the conductances of higher significance $G^+$ or $G^-$, charge is bled into or out of the second capacitor using the pull-up or pull-down circuitry, with the programming pulse terminated in response to the second voltage level associated with the second capacitor crossing the first voltage level associated with the first capacitor in either direction, inverting the output of the comparator.

26. The method of claim 25, further comprising an offset operation, wherein depending on the output of the comparator, a small amount of charge is bled into or out of the second capacitor using pull-up or pull-down circuitry, wherein when the first and second voltage levels are within a predetermined value of each other, the output of the comparator is flipped, ensuring that no programming pulse is fired in the subsequent weight transfer operation.

27. The method of claim 25, wherein for a weight override operation, the first voltage level associated the first capacitor is based on weight information from a peripheral circuit that receives the weight information from an external source.

28. The method of claim 27, wherein the weight override operation is performed on neuromorphic arrays where the synaptic weight is represented by a single conductance pair ($G^+$–$G^-$).

* * * * *